(12) United States Patent
Wang

(10) Patent No.: US 12,733,783 B2
(45) Date of Patent: Sep. 15, 2026

(54) METHOD FOR IDENTIFYING BRUSH TYPE, CLEANING DEVICE AND STORAGE MEDIUM

(71) Applicant: BEIJING XIAOMI MOBILE SOFTWARE CO., LTD., Beijing (CN)

(72) Inventor: Dong Wang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 368 days.

(21) Appl. No.: 18/241,794

(22) Filed: Sep. 1, 2023

(65) Prior Publication Data

US 2024/0389810 A1 Nov. 28, 2024

(30) Foreign Application Priority Data

May 25, 2023 (CN) ......................... 202310603680.5

(51) Int. Cl.

| | |
|---|---|
| ***H02P 23/12*** | (2006.01) |
| ***A46B 13/02*** | (2006.01) |
| ***A47L 9/04*** | (2006.01) |
| ***A47L 9/28*** | (2006.01) |
| ***G01R 27/16*** | (2006.01) |
| ***H02P 23/00*** | (2016.01) |
| ***H02P 23/14*** | (2006.01) |
| ***H03H 11/04*** | (2006.01) |

(52) U.S. Cl.
CPC ............ *A47L 9/2831* (2013.01); *A46B 13/02* (2013.01); *A47L 9/0411* (2013.01); *A47L 9/2847* (2013.01); *A47L 9/2889* (2013.01); *G01R 27/16* (2013.01); *H02P 23/0077* (2013.01); *H02P 23/12* (2013.01); *H02P 23/14* (2013.01); *H03H 11/04* (2013.01); *A46B 2200/3033* (2013.01); *A47L 2201/06* (2013.01)

(58) Field of Classification Search
CPC .. A46B 2200/30; A47L 2201/06; A47L 11/00; A47L 11/4002; A47L 11/4005
See application file for complete search history.

(56) References Cited

U.S. PATENT DOCUMENTS

| | | | | |
|---|---|---|---|---|
| 4,163,999 | A * | 8/1979 | Eaton ..................... | H02H 7/093 361/23 |
| 5,551,119 | A * | 9/1996 | Worwag ................ | A47L 9/2842 15/319 |
| 5,689,169 | A * | 11/1997 | Kerkman ................ | H02P 21/16 318/807 |
| 7,237,298 | B2 * | 7/2007 | Reindle ................. | A47L 9/2842 15/340.1 |
| 9,301,665 | B2 * | 4/2016 | Clothier ................ | A47L 9/2894 |

(Continued)

OTHER PUBLICATIONS

European Patent Application No. 23197176.3 Search Report dated Apr. 9, 2024, 7 pages.

*Primary Examiner* — Rina I Duda
(74) *Attorney, Agent, or Firm* — Cozen O'Connor

(57) ABSTRACT

A method for identifying a brush type of a cleaning device includes: acquiring a detection voltage of a brush motor, the detection voltage being less than a starting voltage of the brush motor; acquiring a first impedance of the brush motor, in response to inputting the detection voltage to the brush motor; and determining a brush type corresponding to the brush motor based on the first impedance and a correspondence between impedances and brush types stored.

20 Claims, 2 Drawing Sheets acquiring a detection voltage of a brush motor of the cleaning device, wherein the detection voltage is less than a starting voltage of the brush motor — 31 acquiring a first impedance of the brush motor, in response to inputting the detection voltage to the brush motor — 32 determining a brush type corresponding to the brush motor based on the first impedance and a correspondence between impedances and brush types stored — 33

(56) References Cited

U.S. PATENT DOCUMENTS

| | | | | |
|---|---|---|---|---|
| 11,000,167 | B2 * | 5/2021 | Zhou | A47L 9/2889 |
| 2017/0119225 | A1 * | 5/2017 | Xia | A47L 11/4041 |
| 2018/0289231 | A1 * | 10/2018 | Santini | A47L 9/2826 |
| 2019/0021567 | A1 | 1/2019 | Zhou | |
| 2019/0117031 | A1 * | 4/2019 | Xie | A47L 9/0477 |
| 2021/0271262 | A1 * | 9/2021 | Alexandrov | G05D 1/0238 |

* cited by examiner

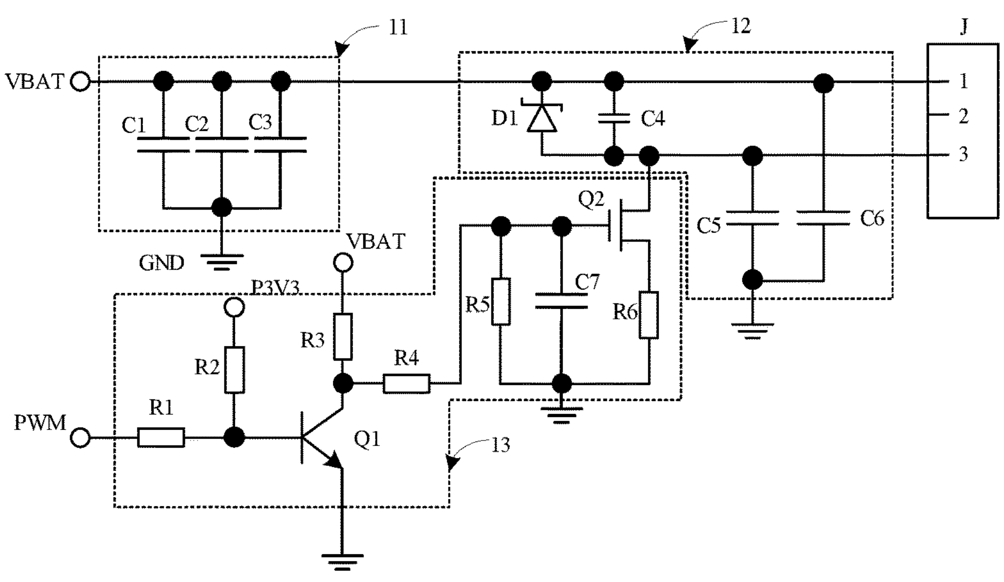

FIG. 1

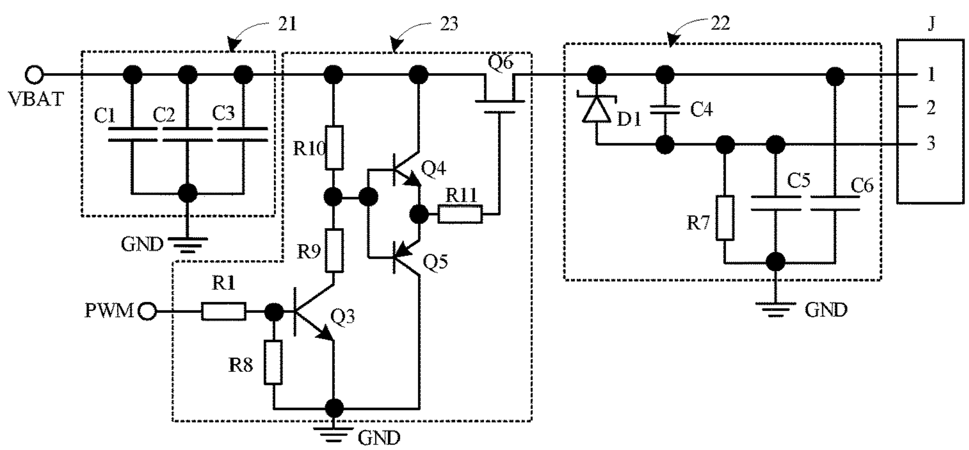

FIG. 2 acquiring a detection voltage of a brush motor of the cleaning device, wherein the detection voltage is less than a starting voltage of the brush motor — 31 acquiring a first impedance of the brush motor, in response to inputting the detection voltage to the brush motor — 32 determining a brush type corresponding to the brush motor based on the first impedance and a correspondence between impedances and brush types stored — 33

FIG. 3

METHOD FOR IDENTIFYING BRUSH TYPE, CLEANING DEVICE AND STORAGE MEDIUM

CROSS-REFERENCE TO RELATED APPLICATION

This application is based upon and claims priority to Chinese Patent Application No. 202310603680.5, filed May 25, 2023, the entire contents of which are incorporated herein by reference.

TECHNICAL FIELD

The present disclosure generally relates to the technical field of control, and more particularly, to a method and apparatus for identifying a brush type, a cleaning device and a storage medium.

BACKGROUND

Cleaning devices have gradually entered people's daily lives, such as vacuum cleaners, window cleaning robots, cleaning machines, etc., which have brought great convenience to people's lives.

In practical applications, to meet the cleaning needs of different situations, the typical cleaning device is usually equipped with various types of electric brushes, such as a mattress brush, a sofa brush, a floor brush, a carpet brush, a mite removal brush or a filter element cleaning brush, etc.

Because different types of brushes have different locked-rotor currents and need different fault protection currents and/or voltages, it is necessary to identify a type of a brush (also called a brush type) before the cleaning device is used, such that a protection operation can be carried out in a timely fashion when the brush fails.

However, the existing scheme for automatically identifying the type of a brush has a low accuracy, which leads to certain hidden dangers during the use of the brush.

SUMMARY

According to a first aspect of embodiments of the present disclosure, there is provided a method for identifying a brush type, which is applicable for a cleaning device and includes: acquiring a detection voltage of a brush motor of the cleaning device, the detection voltage being less than a starting voltage of the brush motor; acquiring a first impedance of the brush motor, in response to inputting the detection voltage to the brush motor; and determining a brush type corresponding to the brush motor based on the first impedance and a correspondence between impedances and brush types stored.

According to a second aspect of embodiments of the present disclosure, there is provided a cleaning device, which includes: at least one electric brush; a processor configured to acquire detection data output by a detection sensor; and a memory having stored therein a computer program executable by the processor. The processor is configured to execute the computer program stored in the memory to implement the method as described in any embodiment of the first aspect.

According to a third aspect of embodiments of the present disclosure, there is provided a non-transitory computer-readable storage medium having stored therein an executable computer program that, when executed by a processor, causes the method as described in any embodiment of the first aspect to be implemented.

It is to be understood that both the foregoing general description and the following detailed description are illustrative and explanatory only and are not restrictive of the present disclosure.

BRIEF DESCRIPTION OF THE DRAWINGS

FIG. 1 is a circuit diagram of a motor driving module according to an embodiment of the present disclosure.

FIG. 2 is a circuit diagram of another motor driving module according to an embodiment of the present disclosure.

FIG. 3 is a flowchart of a method for identifying a brush type according to an embodiment of the present disclosure.

DETAILED DESCRIPTION

Figure 4:
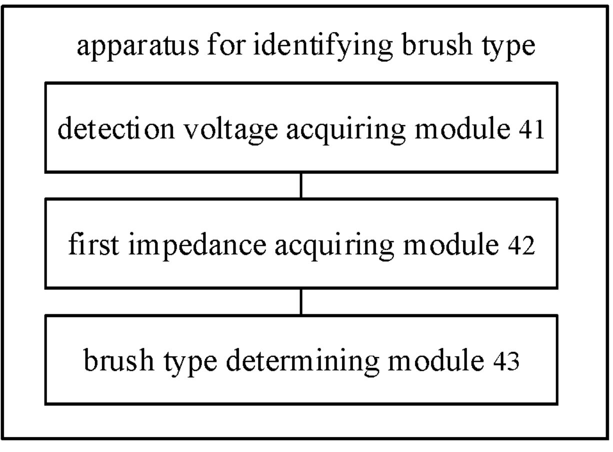
FIG. 4 is a block diagram of an apparatus for identifying a brush type according to an embodiment of the present disclosure.

Reference will now be made in detail to illustrative embodiments, examples of which are illustrated in the accompanying drawings. The following description refers to the accompanying drawings in which the same numbers in different drawings represent the same or similar elements unless otherwise represented. The implementations set forth in the following description of illustrative embodiments do not represent all implementations consistent with embodiments of the present disclosure. Instead, they are merely examples of apparatuses and methods consistent with some aspects of the present disclosure as recited in the appended claims.

In order to solve the above technical problems, embodiments of the present disclosure provide a method and apparatus for identifying a brush type, a cleaning device and a storage medium. The method for identifying the brush type is applicable for a cleaning device. The cleaning device includes at least one electric brush and a processor, each of the at least one electric brush includes a brush motor and an motor driving module, and the motor driving module is electrically connected with the processor and the brush motor, and configured to drive an operation of the brush motor according to a control signal of the processor.

Embodiments of the present disclosure provide a method and an apparatus for identifying a brush type, a cleaning device and a storage medium to solve the above technical problems.

In some embodiments of the present disclosure, there is provided a method for identifying a brush type, which is applicable for a cleaning device and includes: acquiring a detection voltage of a brush motor of the cleaning device, the detection voltage being less than a starting voltage of the brush motor; acquiring a first impedance of the brush motor, in response to inputting the detection voltage to the brush motor; and determining a brush type corresponding to the brush motor based on the first impedance and a correspondence between impedances and brush types stored.

In an embodiment, acquiring the detection voltage of the brush motor of the cleaning device includes: acquiring respective starting voltages of at least one brush motor of the cleaning device to obtain an initial detection voltage, the initial detection voltage being less than a minimum starting voltage by at least one voltage adjustment step; determining a duty ratio of a driving signal based on the initial detection voltage and a battery voltage; and controlling an operation of the brush motor according to the duty ratio to obtain the detection voltage of the brush motor.

In an embodiment, acquiring the first impedance of the brush motor includes: acquiring an operating current of the brush motor to obtain a detection current; and determining the first impedance of the brush motor according to the detection voltage and the detection current.

In an embodiment, the method further includes: determining a motor control parameter corresponding to the brush type based on a correspondence between brush types and motor control parameters preset, the motor control parameter including at least one of: a driving voltage, a protection current and a protection voltage of an electric brush; and controlling an operation of the electric brush according to the motor control parameter.

In some embodiments of the present disclosure, there is provided an apparatus for identifying a brush type, which is applicable for a cleaning device and includes: a detection voltage acquiring module, a first impedance acquiring module, and a brush type determining module. The detection voltage acquiring module is configured to acquire a detection voltage of a brush motor of the cleaning device. The detection voltage is less than a starting voltage of the brush motor. The first impedance acquiring module is configured to acquire a first impedance of the brush motor, in response to inputting the detection voltage to the brush motor. The brush type determining module is configured to determine a brush type corresponding to the brush motor based on the first impedance and a correspondence between impedances and brush types stored.

In an embodiment, the detection voltage acquiring module includes: an initial voltage acquiring unit, a duty ratio determining unit, and a detection voltage acquiring unit. The initial voltage acquiring unit is configured to acquire respective starting voltages of at least one brush motor of the cleaning device to obtain an initial detection voltage. The initial detection voltage is less than a minimum starting voltage by at least one voltage adjustment step. The duty ratio determining unit is configured to determine a duty ratio of a driving signal based on the initial detection voltage and a battery voltage. The detection voltage acquiring unit is configured to control an operation of the brush motor according to the duty ratio to obtain the detection voltage of the brush motor.

In an embodiment, the first impedance acquiring module includes: a detection current acquiring unit and a first impedance determining unit. The detection current acquiring unit is configured to acquire an operating current of the brush motor to obtain a detection current. The first impedance determining unit is configured to determine the first impedance of the brush motor according to the detection voltage and the detection current.

In an embodiment, the apparatus further includes: a motor parameter determining module and an electric brush control module. The motor parameter determining module is configured to determine a motor control parameter corresponding to the brush type based on a correspondence between brush types and motor control parameters preset. The motor control parameter includes at least one of: a driving voltage, a protection current and a protection voltage of the electric brush. The electric brush control module is configured to control an operation of an electric brush according to the motor control parameter.

In some embodiments of the present disclosure, there is provided a cleaning device, which includes: at least one electric brush; a processor configured to acquire detection data output by a detection sensor; and a memory having stored therein a computer program executable by the processor. The processor is configured to execute the computer program stored in the memory to implement the method as described in any embodiment of the first aspect.

In an embodiment, the cleaning device further includes: a current detection module. The current detection module is electrically connected with the processor and configured to detect an operating current of a brush motor to obtain a detection current. The processor is configured to acquire a first impedance of the brush motor according to the detection current.

In an embodiment, the electric brush includes a brush motor and a motor driving module. The motor driving module is electrically connected with the processor and the brush motor, and configured to drive an operation of the brush motor according to a control signal from the processor.

In an embodiment, the motor driving module includes a first filter circuit, a second filter circuit, a motor interface and a grounding control circuit. The first filter circuit is electrically connected with the motor interface, the second filter circuit and a battery. The second filter circuit is electrically connected with the motor interface. The grounding control circuit is electrically connected with the second filter circuit and a ground terminal of the motor interface, and configured to: ground the ground terminal of the motor interface when the control signal is at a first level, so that the battery of the cleaning device, a power terminal of the motor interface, the brush motor, the ground terminal of the motor interface and the grounding control circuit form a power supply loop, or not ground the ground terminal of the motor interface when the control signal is at a second level, so that the battery of the cleaning device does not supply power to the brush motor.

In an embodiment, the first filter circuit includes a first capacitor, a second capacitor and a third capacitor. A first terminal of the first capacitor is electrically connected with the battery, and a second terminal of the first capacitor is grounded. A first terminal of the second capacitor is electrically connected with the battery, and a second terminal of the second capacitor is grounded. A first terminal of the third capacitor is electrically connected with the battery, and a second terminal of the third capacitor is grounded.

In an embodiment, the second filter circuit includes a fourth capacitor, a fifth capacitor, a sixth capacitor and a stabilivolt. A first terminal of the stabilivolt is electrically connected with the battery, and a second terminal of the stabilivolt is electrically connected with a second terminal of the fourth capacitor, a first terminal of the fifth capacitor and the ground terminal of the motor interface. A first terminal of the fourth capacitor is electrically connected with the battery. A second terminal of the fifth capacitor is grounded. A first terminal of the sixth capacitor is electrically connected with the battery, and a second terminal of the sixth capacitor is grounded.

In an embodiment, the grounding control circuit includes a first resistor, a second resistor, a third resistor, a fourth resistor, a fifth resistor, a sixth resistor, a first switching element, a second switching element and a seventh capacitor. A first terminal of the first resistor is electrically connected with the processor, and a second terminal of the first resistor is electrically connected with a second terminal of the second resistor and a control terminal of the first switching element. A first terminal of the second resistor is electrically connected with a second power supply. A first terminal of the first switching element is electrically connected with a second terminal of the third resistor and a first terminal of the fourth resistor, and a second terminal of the first switching element is grounded. A first terminal of the third resistor is electrically connected with the battery. A second terminal of the fourth resistor is electrically connected with a first terminal of the fifth resistor and a first terminal of the seventh capacitor. A second terminal of the fifth resistor is grounded. A second terminal of the seventh capacitor is grounded. A control terminal of the second switching element is electrically connected with a first terminal of the seventh capacitor, a first terminal of the second switching element is electrically connected with a second terminal of a stabilivolt in the second filter circuit, and a second terminal of the second switching element is electrically connected with a first terminal of the sixth resistor. A second terminal of the sixth resistor is grounded.

In an embodiment, the second filter circuit further includes a seventh resistor, a first terminal of the seventh resistor is electrically connected with the ground terminal of the motor interface, and a second terminal of the seventh resistor is grounded.

In an embodiment, the grounding control circuit includes a first resistor, an eighth resistor, a ninth resistor, a tenth resistor, an eleventh resistor, a third switching element, a fourth switching element, a fifth switching element and a sixth switching element. A first terminal of the first resistor is electrically connected with the processor, and a second terminal of the first resistor is electrically connected with a first terminal of the eighth resistor and a control terminal of the third switching element. A second terminal of the eighth resistor is grounded. A second terminal of the third switching element is grounded, and a first terminal of the third switching element is electrically connected with a second terminal of the ninth resistor. A first terminal of the ninth resistor is electrically connected with a second terminal of the tenth resistor, a control terminal of the fourth switching element and a control terminal of the fifth switching element. A first terminal of the tenth resistor is electrically connected with the battery. A first terminal of the fourth switching element is electrically connected with the battery. A second terminal of the fifth switching element is grounded. A first terminal of the eleventh resistor is electrically connected with a second terminal of the fourth switching element and a first terminal of the fifth switching element, and a second terminal of the eleventh resistor is electrically connected with a control terminal of the sixth switching element. A first terminal of the sixth switching element is electrically connected with the battery, and a second terminal of the sixth switching element is electrically connected with the power terminal of the motor interface.

In some embodiments of the present disclosure, there is provided a non-transitory computer-readable storage medium having stored therein an executable computer program that, when executed by a processor, causes the method as described in any embodiment of the first aspect to be implemented.

With embodiments of the present disclosure, the detection voltage of the brush motor of the cleaning device may be acquired, and the detection voltage is less than the starting voltage of the brush motor; the first impedance of the brush motor may be acquired in response to inputting the detection voltage to the brush motor; and the brush type corresponding to the first impedance may be determined based on the first impedance and the correspondence between impedances and brush types stored. In this way, in embodiments of the present disclosure, the brush type is determined according to the first impedance of a power supply loop, which improves the accuracy for determining the brush type, and improves the safety of the brush.

In an embodiment, the cleaning device further includes a current detection module. The current detection module is electrically connected with the processor and configured to detect an operating current of the brush motor to obtain a detection current, and the processor is configured to acquire a first impedance of the brush motor according to the detection current. In an embodiment, the current detection module may be implemented by a current sampling resistor.

In an embodiment, the motor driving module includes a first filter circuit, a second filter circuit, a motor interface and a grounding control circuit. The first filter circuit is electrically connected with the motor interface, the second filter circuit and the battery. The second filter circuit is electrically connected with the motor interface. The grounding control circuit is electrically connected with the second filter circuit and a ground terminal of the motor interface, and configured to: ground the ground terminal of the motor interface when the control signal is at a first level, so that a battery of the cleaning device, a power terminal of the motor interface, the brush motor, the ground terminal of the motor interface and the grounding control circuit form a power supply loop, or not ground the ground terminal of the motor interface when the control signal is at a second level, so that the battery of the cleaning device does not supply power to the brush motor.

In an embodiment, referring to FIG. 1, the first filter circuit 11 includes a first capacitor C1, a second capacitor C2 and a third capacitor C3.

A first terminal of the first capacitor C1 is electrically connected with the battery (marked by VBAT), and a second terminal of the first capacitor C1 is grounded to GND.

A first terminal of the second capacitor C2 is electrically connected to the battery (marked by VBAT), and a second terminal of the second capacitor C2 is grounded to GND.

A first terminal of the third capacitor C3 is electrically connected to the battery (denoted by VBAT), and a second terminal of the third capacitor C3 is grounded to GND.

In an example, the first capacitor C1 may be implemented using a capacitor of 4.7 uF, the second capacitor C2 may be implemented using a capacitor of 100 nF, and the third capacitor C3 may be implemented using a capacitor of 4.7 uF. Appropriate capacitive reactance values can be chosen by those skilled in the art according to specific scenes, as long as the first filter circuit 11 can filter a voltage ripple, and corresponding embodiments fall within the protection scope of the present disclosure.

In an embodiment, referring to FIG. 1, the second filter circuit 12 includes a fourth capacitor C4, a fifth capacitor C5, a sixth capacitor C6 and a stabilivolt D1.

A first terminal of the stabilivolt DI is electrically connected with the battery (marked by VBAT), and a second terminal of the stabilivolt DI is electrically connected with a second terminal of the fourth capacitor C4, a first terminal of the fifth capacitor C5 and a ground terminal of the motor interface J.

A first terminal of the fourth capacitor C4 is electrically connected with the battery (marked by VBAT), and a second terminal of the fifth capacitor C5 is grounded to GND.

A first terminal of the sixth capacitor C6 is electrically connected to the battery (marked by VBAT), and a second terminal of the sixth capacitor C6 is grounded to GND.

In an example, the stabilivolt D1 is configured to clamp a voltage difference between a power terminal 1 and a ground terminal 3 of the motor interface J, to ensure that the brush motor of the electric brush can operate normally. The fourth capacitor C4 may be implemented by a capacitor of 1 nF. The fifth capacitor C5 may be implemented by a capacitor of 100 nF. The sixth capacitor C6 may be implemented by a capacitor of 100 nF. Capacitive reactance values of these capacitors can be chosen by those skilled in the art according to specific scenes, as long as a ripple in an input voltage of the motor interface can be filtered, and corresponding embodiments fall within the protection scope of the present disclosure.

In an embodiment, referring to FIG. 1, the grounding control circuit 13 includes a first resistor R1, a second resistor R2, a third resistor R3, a fourth resistor R4, a fifth resistor R5, a sixth resistor R6, a first switching element Q1, a second switching element Q2 and a seventh capacitor C7.

A first terminal of the first resistor R1 is electrically connected with the processor, and a second terminal of the first resistor R1 is electrically connected with a second terminal of the second resistor R2 and a control terminal of the first switching element Q1.

A first terminal of the second resistor R2 is electrically connected with a second power supply (represented by P3V3).

A first terminal of the first switching element Q1 is electrically connected with a second terminal of the third resistor R3 and a first terminal of the fourth resistor R4, and a second terminal of the first switching element Q1 is grounded to GND.

A first terminal of the third resistor R3 is electrically connected with the battery (marked by VBAT).

A second terminal of the fourth resistor R4 is electrically connected with a first terminal of the fifth resistor R5 and a first terminal of the seventh capacitor C7. A second terminal of the fifth resistor R5 is grounded. A second terminal of the seventh capacitor C7 is grounded.

A control terminal of the second switching element Q2 is electrically connected with a first terminal of the seventh capacitor C7 and a first terminal of the fifth resistor R5, a first terminal of the second switching element Q2 is electrically connected with the second terminal of the stabilivolt DI in the second filter circuit 12, and a second terminal of the second switching element Q2 is electrically connected with a first terminal of the sixth resistor R6. A second terminal of the sixth resistor R6 is grounded to GND.

In an example, the first resistor R1 may be implemented by a resistor of 100 ohm, the second resistor R2 may be implemented by a resistor of 10k ohm, the third resistor R3 may be implemented by a resistor of 2.2k ohm, the fourth resistor R4 may be implemented by a resistor of 22 ohm, the fifth resistor R5 may be implemented by a resistor of 10k ohm, the sixth resistor may be implemented by a resistor of 0.1 ohm, and the seventh capacitor C7 may be implemented by a capacitor of 100 nF. Impedance value of each element in the grounding control circuit 13 can be chosen by those skilled in the art according to specific scenes, and corresponding embodiments fall within the protection scope of the present disclosure.

Referring to FIG. 1, when the first switching element Q1 is implemented by an N-type switching element, and the second switching element Q2 is implemented by an N-type switching element, the N-type switching element may include an NPN transistor or an NMOS transistor, and the operating principle of the motor driving module is as follows.

The processor outputs a control signal, which may be a pulse width modulation (PWM) signal. For each PWM cycle, a first level and a second level may be included.

When the control signal is at the first level (such as a high level), the first switching element Q1 is turned off, the third resistor R3, the fourth resistor R4 and the fifth resistor R5 form a discharge loop, and the first terminal of the fifth resistor R5 is at a high level. Because the second switching element Q2 is an N-type switching element, the second switching element Q2 is turned on at this time, that is, a power supply loop is formed among the battery, the power terminal of the motor interface J, the brush motor (not shown in the figure), the ground terminal of the motor interface J, the second switching element Q2, the sixth resistor R6 and the ground GND.

In an example, the sixth resistor R6 is a current sampling resistor, and the first terminal of the sixth resistor R6 may be electrically connected with the processor, so as to obtain a corresponding operating current of the electric brush, i.e., the detection current. In other words, the sixth resistor R6 is used as the current detection module described above.

When the control signal is at the second level (such as a low level), the first switching element Q1 is turned on, and the fourth resistor R4 is grounded, that is, the first terminal of the fifth resistor R5 is at a low level. Because the second switching element Q2 is an N-type switching element, the second switching element Q2 is turned off at this time, that is, the ground terminal of the motor interface J cannot be grounded, so that a power supply loop from the battery to the ground cannot be formed. In other words, during this stage, the electric brush cannot receive the input voltage. In an embodiment, a duty ratio of the PWM signal is adjustable. In embodiments of the present disclosure, the setting of the above duty ratio needs to ensure that the brush motor of the electric brush cannot rotate, so as to ensure that no abnormal noise is generated during the detection. The setting process of the duty ratio may include the following actions.

The processor may acquire a starting voltage of the brush motor in at least one electric brush of the cleaning device to obtain a minimum starting voltage. Then, the processor may set the detection voltage to a maximum value less than the minimum starting voltage. For example, if the minimum starting voltage is 2.1 V, the detection voltage may be set to 2 V. The detection voltage can be determined by those skilled in the art according to the starting voltage, the detection voltage and a minimum adjustment size of the voltage. For example, an integer voltage less than the minimum starting voltage may be selected as the detection voltage. It will be understood that embodiments where the detection voltage is less than the minimum starting voltage fall within the protection scope of the present disclosure.

It should be noted that the cleaning device has stored therein a starting voltage of the brush motor of each of the at least one electric brush. For example, the cleaning device has stored therein a starting voltage table. The starting voltage table may be written into a memory of the cleaning device in advance, and in this case, the starting voltage table may include starting voltages of all the brush motors adapted to the cleaning device, or starting voltages of brush motors included in various types of cleaning devices. The starting voltage table may also be generated based on a user's configuration. For example, when the cleaning device is used for the first time, the cleaning device may generate and display a configuration suggestion, which allows the user to insert individual brushes into a brush mouth in turn for the cleaning device to detect the brush type. When the configuration action is completed, the cleaning device may write starting voltages of various types of brush motors detected in the configuration process into the starting voltage table. In the subsequent detection process, starting voltages in the updated starting voltage table may be used.

The processor may acquire a battery voltage of the battery, and then determine a ratio of the detection voltage to the battery voltage to obtain the duty ratio of each PWM signal. For example, if the battery voltage is 20 V and the detection voltage is 2 V, the duty ratio of each PWM signal is 2/20*100% =10%. In this way, the processor may output a voltage of 20 V in 10% of the time within each PWM cycle and output a voltage of 0 V in the remaining 90% of the time within the each PWM cycle, so that the average voltage in each PWM cycle is 2 V, that is, the effect of outputting the detection voltage of 2 V is achieved.

It should be noted that in order to ensure that the high level in each PWM cycle cannot start the brush motor, the frequency of the PWM signal needs to be high enough. In an example, the frequency of the PWM signal is in a range of 1 kHz to 10 kHz, so that the duration of the high level in each PWM cycle is too short to start the brush motor. The frequency of the PWM signal can be chosen by those skilled in the art according to the type of the brush motor, and corresponding embodiments fall within the protection scope of the present disclosure.

In an embodiment, referring to FIG. 2, the motor driving module includes a first filter circuit 21, a second filter circuit 22 and a grounding control circuit 23.

The circuit structure of the first filter circuit 21 is the same as that of the first filter circuit 11, and will not be elaborated here.

The circuit structure of the second filter circuit 22 is mostly the same as that of the second filter circuit 12, except that the second filter circuit 22 further includes a seventh resistor R7. A first terminal of the seventh resistor R7 is electrically connected with the ground terminal 3 of the motor interface, and a second terminal of the seventh resistor R7 is grounded to GND. In this way, the second filter circuit 22 can always ground the ground terminal 3 of the motor interface by setting the seventh resistor R7.

The grounding control circuit 23 includes a first resistor R1, an eighth resistor R8, a ninth resistor R9, a tenth resistor R10, an eleventh resistor R11, a third switching element Q3, a fourth switching element Q4, a fifth switching element Q5 and a sixth switching element Q6.

A first terminal of the first resistor RI is electrically connected with the processor, and a second terminal of the first resistor R1 is electrically connected with a first terminal of the eighth resistor R8 and a control terminal of the third switching element Q3. A second terminal of the eighth resistor R8 is grounded, and a second terminal of the third switching element Q3 is grounded to GND.

A first terminal of the third switching element Q3 is electrically connected with a second terminal of the ninth resistor R9. A first terminal of the ninth resistor R9 is electrically connected with a second terminal of the tenth resistor R10, a control terminal of the fourth switching element Q4 and a control terminal of the fifth switching element Q5. A first terminal of the tenth resistor R10 is electrically connected with the battery (marked by VBAT).

A first terminal of the fourth switching element Q4 is electrically connected with the battery (marked by VBAT), and a second terminal of the fifth switching element Q5 is grounded to GND.

A first terminal of the eleventh resistor R11 is electrically connected with a second terminal of the fourth switching element Q4 and a first terminal of the fifth switching element Q5. A second terminal of the eleventh resistor R11 is electrically connected with a control terminal of the sixth switching element Q6.

A first terminal of the sixth switching element Q6 is electrically connected with the battery (marked by VBAT).

A second terminal of the sixth switching element Q6 is electrically connected with a power terminal 1 of the motor interface J.

It should be noted that the eighth resistor may be implemented by a resistor of 10 k ohm, the ninth resistor R9 may be implemented by a resistor of 1 k ohm, the tenth resistor R10 may be implemented by a resistor of 2.2 k ohm, the eleventh resistor R11 may be implemented by a resistor of 100 ohm, and the seventh resistor may be implemented by a resistor of 0.1 ohm. Appropriate resistors may be chosen by those skilled in the art according to specific scenes, and corresponding embodiments fall within the protection scope of the present disclosure.

Referring to FIG. 2, when the third switching element Q3 and the fourth switching element Q4 each are implemented by an N-type switching element, the fifth switching element Q5 is implemented by a P-type switching element, and the sixth switching element Q6 is implemented by a P-type switching element, the N-type switching element may include an NPN transistor or an NMOS transistor, and the P-type switching elements may include a PNP transistor or a PMOS transistor. The operating principle of the motor driving module is as follows.

When the control signal is at the first level (e.g. a high level), the third switching element Q3 is turned on, so that the second terminal of the ninth resistor R9 is grounded, or the first terminal of the ninth resistor R9 is at a low level. The fifth switching element Q5 is turned on, while the fourth switching element Q4 is turned off, and at this time, the battery, the tenth resistor R10 and the fifth switching element Q5 will form a current loop, or in other words, the second terminal of the eleventh resistor R11 is at a low level.

When the second terminal of the eleventh resistor R11 is at a low level, the sixth switching element Q6 is turned on, and the battery, the sixth switching element Q6, the power terminal 1 of the motor interface J, the brush motor, the ground terminal 3 of the motor interface J and the seventh resistor R7 form a power supply loop. At this time, the brush motor can receive the detection voltage.

It can be understood that in embodiments of the present disclosure, the seventh resistor R7 may be used as a current sampling resistor with a resistance value of 0.1 ohm, and its first terminal is electrically connected with the processor, so that the detection current can be input to the processor. In other words, the seventh resistor R7 is used as the current detection module as described above.

When the control signal is at the second level (e.g. a low level), the third switching element Q3 is turned off; the control terminal of the fourth switching element Q4 is at the battery voltage, that is the fourth switching element Q4 is turned on at the high level, while the fifth switching element Q5 is turned off; the control terminal of the sixth switching element Q6 is at a high level, and the sixth switching element Q6 disconnects the connection between the battery and the power terminal 1 of the motor interface J, so that the battery cannot supply power to the brush motor.

Based on the above-described cleaning device, embodiments of the present disclosure also provide a method for identifying a brush type, which is applicable for a cleaning device. The cleaning device includes a battery and at least one electric brush. As shown in FIG. 3, the method includes steps 31-33.

In step 31, a detection voltage of a brush motor of the cleaning device is acquired, and the detection voltage is less than a starting voltage of the brush motor.

In this step, the processor may acquire the detection voltage of the brush motor, and the detection voltage is less than a minimum starting voltage of at least one brush motor. The detection voltage may be stored in a designated location of the cleaning device in advance, such as a local memory or a cache. In an embodiment, the processor may acquire a list of electric brushes, and determine the detection voltage according to the minimum starting voltage of various electric brushes in the list.

In an example, the processor may acquire respective starting voltages of at least one brush motor (adapted to the cleaning device) to obtain the minimum starting voltage. It should be noted that the starting voltage of the brush motor is determined after the type of the motor is determined, and may be stored in the designated location of the cleaning device. The processor may acquire a voltage adjustment step. For example, the voltage adjustment step may be in a range of [0.1 V, 1 V]. The processor may determine a voltage less than the minimum starting voltage by at least one voltage adjustment step as an initial detection voltage. For example, if the minimum starting voltage is 2.1 V, and the voltage adjustment step is 0.1 V, the initial detection voltage may be 2.1−0.1=2V. After that, the processor may determine a duty ratio of a driving signal based on the initial detection voltage and the battery voltage. For example, when the initial detection voltage is 2 V, and the battery voltage is 20 V, the duty ratio is 2/20*100% =10%. Finally, the processor may control an operation of the brush motor according to the duty ratio to obtain the detection voltage of the brush motor. That is, the average voltage in a PWM cycle is 2 V, so as to achieve the effect of outputting the detection voltage of 2 V.

In step 32, a first impedance of the brush motor is acquired, in response to inputting the detection voltage to the brush motor.

In this step, the processor may acquire the first impedance of the brush motor, in response to inputting the detection voltage to the brush motor. It should be noted that after the above detection voltage is input to the electric brush, the brush motor is not started because the detection voltage is less than the starting voltage of the brush motor. In an example, the processor acquires an operating current of the brush motor to obtain a detection current. The detection current may be acquired in a manner as described in embodiments where the current sampling resistor is set with reference to FIG. 1 and FIG. 2 Then, the processor may determine the first impedance of the brush motor according to the detection voltage and the detection current. In an embodiment, the first impedance is obtained by dividing the detection voltage by the detection current.

In step 33, a brush type corresponding to the brush motor is determined based on the first impedance and a correspondence between impedances and brush types stored.

In this step, the cleaning device has stored therein the correspondence between impedances and brush types, and the correspondence includes values of impedances corresponding to various brush types. For example, an impedance of 1 ohm corresponds to a floor brush; an impedance of 2 ohm corresponds to a carpet brush; an impedance of 3 ohm corresponds to sofa brush, and so on. In this way, the processor may determine the brush type corresponding to the brush motor obtained in step 32 based on the first impedance and the correspondence between impedances and brush types.

In an embodiment, the method for identifying the brush type provided by embodiments of the present disclosure further includes: determining a motor control parameter corresponding to the brush type based on a correspondence between brush types and motor control parameters stored.

It is understandable that, the preset correspondence between brush types and motor control parameters is stored in the cleaning machine, and the correspondence includes the motor control parameter corresponding to each of the brush types. In an example, the motor control parameter includes at least one of: a driving voltage, a protection current and a protection voltage of an electric brush. For example, when the brush type is a floor brush, the driving voltage of the electric brush is 5 V, the protection current is 2 A, and the protection voltage is 6 V, which can be set according to specific scenes. In this way, the processor can control an operation of the electric brush according to the motor control parameter, so as to accurately control the electric brush.

With the embodiments of the present disclosure, the detection voltage of the brush motor of the cleaning device may be acquired, and the detection voltage is less than the starting voltage of the brush motor; the first impedance of the brush motor may be acquired in response to inputting the detection voltage to the brush motor; and the brush type corresponding to the brush motor may be determined based on the first impedance and the correspondence between impedances and brush types stored. In this way, in embodiments of the present disclosure, the brush type is determined according to the first impedance of a power supply loop, which improves the accuracy for determining the brush type, and improves the safety of the brush.

In embodiments of the present disclosure, different types of brushes are identified by detecting the first impedance of the brush motor. After powered on, the brush motor is supplied with a small detection voltage, and a current of the motor is detected to determine the first impedance of the motor, and the type of the brush motor is determined according to the first impedance, so as to intelligently identify different brush motors. Embodiments of the present disclosure are applicable for a hand-held vacuum cleaner to automatically determine the type of the brush motor when the hand-held vacuum cleaner is powered on and before the brush rotates. With embodiments of the present disclosure, on the one hand, an appropriate locked-rotor current may be set, which avoids the problem of unstable operation of the whole machine and eliminates potential safety hazards; and on the other hand, an appropriate operating voltage may be set to enable the motor to reach a best operating state, thereby improving the motor efficiency and prolonging the operating time.

Embodiments of the present disclosure also provide an apparatus for identifying a brush type, which is applicable for a cleaning device. The cleaning device includes a battery and at least one electric brush. Referring to FIG. 4, the apparatus includes: a detection voltage acquiring module 41, a first impedance acquiring module 42, and a brush type determining module 43.

The detection voltage acquiring module 41 is configured to acquire a detection voltage of a brush motor of the cleaning device. The detection voltage is less than a starting voltage of the brush motor.

The first impedance acquiring module 42 is configured to acquire a first impedance of the brush motor, in response to inputting the detection voltage to the brush motor.

The brush type determining module 43 is configured to determine a brush type corresponding to the brush motor based on the first impedance and a correspondence between impedances and brush types stored.

In an embodiment, the detection voltage acquiring module includes: an initial voltage acquiring unit, a duty ratio determining unit, and a detection voltage acquiring unit.

The initial voltage acquiring unit is configured to acquire respective starting voltages of at least one brush motor of the cleaning device to obtain an initial detection voltage. The initial detection voltage is less than a minimum starting voltage by at least one voltage adjustment step.

The duty ratio determining unit is configured to determine a duty ratio of a driving signal based on the initial detection voltage and a battery voltage.

The detection voltage acquiring unit is configured to control an operation of the brush motor according to the duty ratio to obtain the detection voltage of the brush motor.

In an embodiment, the first impedance acquiring module includes: a detection current acquiring unit and a first impedance determining unit.

The detection current acquiring unit is configured to acquire an operating current of the brush motor to obtain a detection current.

The first impedance determining unit is configured to determine the first impedance of the brush motor according to the detection voltage and the detection current.

In an embodiment, the apparatus further includes: a motor parameter determining module and an electric brush control module.

The motor parameter determining module is configured to determine a motor control parameter corresponding to the brush type based on a correspondence between brush types and motor control parameters preset. The motor control parameter includes at least one of: a driving voltage, a protection current and a protection voltage of the electric brush.

The electric brush control module is configured to control an operation of an electric brush according to the motor control parameter.

Figure 5:
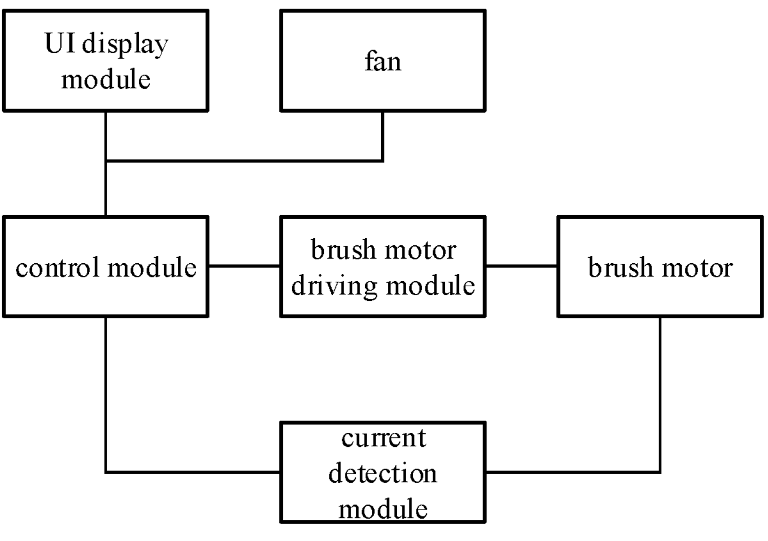
FIG. 5 is a block diagram of a cleaning device according to an embodiment of the present disclosure.

It should be noted that the apparatus shown in embodiments of the present disclosure are matched with the above contents of the method embodiments, so reference can be made to the contents of the method embodiments, which will not be elaborated here Embodiments of the present disclosure also provide a cleaning device. Referring to FIG. 5, the cleaning device includes a control module (i.e., the above-described processor), a brush motor driving module (i.e., the above-described motor driving module), a brush motor, a current detection module (i.e., a current sampling resistor), a fan and a UI display module.

The control module, i.e., the above-described processor, is configured to control the brush motor driving module to drive different types of brush motors, drive the fan to rotate rapidly to suck dusts, send a message or instruction to the UI display module, monitor current information detected by the current detection module to determine the type of the brush motor, and store first impedances of different types of brush motors.

The brush motor driving module may be implemented by a voltage-type driving circuit with a high frequency switch, and may achieve different output voltages by configuring different duty ratios to drive the operation of the brush motor.

The brush motor will rotate quickly when operating, and drives the brush to rotate on the ground through a gear box to achieve a certain cleaning effect. Different brush motors are used in different scenes.

The control module drives different brush motors through the brush motor driving module and sets different protection currents.

The current detection module is configured to detect an operating current of the brush motor, i.e., the detection current, and send the detection current to the control module.

The fan is configured to suck dirt and dust from the ground into a dust cup. The power and vacuum degree of the fan may be controlled by the control module, so as to achieve different cleaning effects.

The UI display module communicates with the control module through a bus, and configured to perform human-machine interaction, display a current state of the machine, and provide an interactive interface.

Embodiment of the present disclosure also provides a non-transitory computer-readable storage medium having stored therein an executable computer program that, when executed by a processor, causes the method as shown in FIG. 4 to be implemented.

Terms used in present disclosure are for the purpose of describing specific embodiments, and are not intended to limit the present disclosure. Unless otherwise defined, technical terms or scientific terms used in the present disclosure shall have their ordinary meanings as understood by persons with ordinary skills in the art to which the present disclosure belongs. As used in the specification and the appended claims of the present disclosure, "a", "an", and the like do not constitute a quantitative limit, but are intended to indicate at least one related items. It should also be understood that, the phrase "a plurality of" means at least two. Terms such as "comprise", "include" and any other variation thereof mean that an element or object before the word "comprise" or "include" covers elements or objects and their equivalents listed after the word "comprise" or "include", and do not exclude other elements or objects. In the present disclosure, unless specified or limited otherwise, the terms "connected," "coupled," and the like are not limited to physical or mechanical connection, but may include electrical connection, whether direct or indirect. As used in the specification and the appended claims of the present disclosure, "a/an", "said" and "the" in singular forms are intended to include plural forms, unless clearly indicated in the context otherwise. It should also be understood that, the term "and/or" used herein represents and contains any or all possible combinations of one or more associated listed items.

For the method embodiments, because they basically correspond to the device embodiments, reference can be made to the description of relevant parts of the device embodiments. The method embodiments and the device embodiments are complementary to each other.

The above only describes some embodiments or example of the present disclosure, and is not intended to limit the present disclosure. It would be appreciated by those skilled in the art that any changes, alternatives, modifications and variant made without departing from the spirit and principles of the present disclosure shall be included in the protection scope of the present disclosure.

What is claimed is:

1. A method for identifying a brush type, performed by a cleaning device, comprising:

acquiring a detection voltage of a brush motor of the cleaning device, wherein the detection voltage is less than a starting voltage of the brush motor, and the brush motor is not started;

acquiring a first impedance of the brush motor, in response to inputting the detection voltage to the brush motor; and determining a brush type corresponding to the brush motor based on the first impedance and a correspondence between impedances and brush types stored.

2. The method according to claim 1, wherein acquiring the detection voltage of the brush motor of the cleaning device comprises:

acquiring respective starting voltages of at least one brush motor of the cleaning device to obtain an initial detection voltage, wherein the initial detection voltage is less than a minimum starting voltage by at least one voltage adjustment step;

determining a duty ratio of a driving signal based on the initial detection voltage and a battery voltage; and controlling an operation of the brush motor according to the duty ratio to obtain the detection voltage of the brush motor.

3. The method according to claim 1, wherein acquiring the first impedance of the brush motor comprises:

acquiring an operating current of the brush motor to obtain a detection current; and determining the first impedance of the brush motor according to the detection voltage and the detection current.

4. The method according to claim 1, further comprising:

determining a motor control parameter corresponding to the brush type based on a correspondence between brush types and motor control parameters stored, wherein the motor control parameter comprises at least one of: a driving voltage, a protection current and a protection voltage of an electric brush; and controlling an operation of the electric brush according to the motor control parameter.

5. A cleaning device, comprising:

at least one electric brush;

a processor configured to acquire detection data output by a detection sensor; and a memory having stored therein a computer program executable by the processor;

wherein the processor is configured to execute the computer program stored in the memory to:

acquire a detection voltage of a brush motor of the cleaning device, wherein the detection voltage is less than a starting voltage of the brush motor, and the brush motor is not started;

acquire a first impedance of the brush motor, in response to inputting the detection voltage to the brush motor; and determine a brush type corresponding to the brush motor based on the first impedance and a correspondence between impedances and brush types stored.

6. The cleaning device according to claim 5, wherein the processor is further configured to:

acquire respective starting voltages of at least one brush motor of the cleaning device to obtain an initial detection voltage, wherein the initial detection voltage is less than a minimum starting voltage by at least one voltage adjustment step;

determine a duty ratio of a driving signal based on the initial detection voltage and a battery voltage; and control an operation of the brush motor according to the duty ratio to obtain the detection voltage of the brush motor.

7. The cleaning device according to claim 5, wherein the processor is further configured to:

acquire an operating current of the brush motor to obtain a detection current; and determine the first impedance of the brush motor according to the detection voltage and the detection current.

8. The cleaning device according to claim 5, wherein the processor is further configured to:

determine a motor control parameter corresponding to the brush type based on a correspondence between brush types and motor control parameters stored, wherein the motor control parameter comprises at least one of: a driving voltage, a protection current and a protection voltage of an electric brush; and control an operation of the electric brush according to the motor control parameter.

9. The cleaning device according to claim 5, further comprising:

a current detection module electrically connected with the processor and configured to detect an operating current of a brush motor to obtain a detection current, wherein the processor is configured to acquire the first impedance of the brush motor according to the detection current.

10. The cleaning device according to claim 5, wherein the electric brush comprises a brush motor and a motor driving module; and the motor driving module is electrically connected with the processor and the brush motor, and configured to drive an operation of the brush motor according to a control signal from the processor.

11. The cleaning device according to claim 10, wherein the motor driving module comprises a first filter circuit, a second filter circuit, a motor interface and a grounding control circuit;

the first filter circuit is electrically connected with the motor interface, the second filter circuit and a battery;

the second filter circuit is electrically connected with the motor interface;

the grounding control circuit is electrically connected with the second filter circuit and a ground terminal of the motor interface, and configured to:

ground the ground terminal of the motor interface when the control signal is at a first level, so that the battery of the cleaning device, a power terminal of the motor interface, the brush motor, the ground terminal of the motor interface and the grounding control circuit form a power supply loop, or not ground the ground terminal of the motor interface when the control signal is at a second level, so that the battery of the cleaning device does not supply power to the brush motor.

12. The cleaning device according to claim 11, wherein the first filter circuit comprises a first capacitor, a second capacitor and a third capacitor;

a first terminal of the first capacitor is electrically connected with the battery, and a second terminal of the first capacitor is grounded;

a first terminal of the second capacitor is electrically connected with the battery, and a second terminal of the second capacitor is grounded;

a first terminal of the third capacitor is electrically connected with the battery, and a second terminal of the third capacitor is grounded.

13. The cleaning device according to claim 11, wherein the second filter circuit comprises a fourth capacitor, a fifth capacitor, a sixth capacitor and a stabilivolt;

a first terminal of the stabilivolt is electrically connected with the battery, and a second terminal of the stabilivolt is electrically connected with a second terminal of the fourth capacitor, a first terminal of the fifth capacitor and the ground terminal of the motor interface;

a first terminal of the fourth capacitor is electrically connected with the battery;

a second terminal of the fifth capacitor is grounded; and a first terminal of the sixth capacitor is electrically connected with the battery, and a second terminal of the sixth capacitor is grounded.

14. The cleaning device according to claim 11, wherein the grounding control circuit comprises a first resistor, a second resistor, a third resistor, a fourth resistor, a fifth resistor, a sixth resistor, a first switching element, a second switching element and a seventh capacitor;

a first terminal of the first resistor is electrically connected with the processor, and a second terminal of the first resistor is electrically connected with a second terminal of the second resistor and a control terminal of the first switching element;

a first terminal of the second resistor is electrically connected with a second power supply;

a first terminal of the first switching element is electrically connected with a second terminal of the third resistor and a first terminal of the fourth resistor, and a second terminal of the first switching element is grounded;

a first terminal of the third resistor is electrically connected with the battery;

a second terminal of the fourth resistor is electrically connected with a first terminal of the fifth resistor and a first terminal of the seventh capacitor; a second terminal of the fifth resistor is grounded;

a second terminal of the seventh capacitor is grounded;

a control terminal of the second switching element is electrically connected with a first terminal of the seventh capacitor, a first terminal of the second switching element is electrically connected with a second terminal of a stabilivolt in the second filter circuit, and a second terminal of the second switching element is electrically connected with a first terminal of the sixth resistor; and a second terminal of the sixth resistor is grounded.

15. The cleaning device according to claim 13, wherein the second filter circuit further comprises a seventh resistor, a first terminal of the seventh resistor is electrically connected with the ground terminal of the motor interface, and a second terminal of the seventh resistor is grounded.

16. The cleaning device according to claim 11, wherein the grounding control circuit comprises a first resistor, an eighth resistor, a ninth resistor, a tenth resistor, an eleventh resistor, a third switching element, a fourth switching element, a fifth switching element and a sixth switching element;

a first terminal of the first resistor is electrically connected with the processor, and a second terminal of the first resistor is electrically connected with a first terminal of the eighth resistor and a control terminal of the third switching element;

a second terminal of the eighth resistor is grounded;

a second terminal of the third switching element is grounded, and a first terminal of the third switching element is electrically connected with a second terminal of the ninth resistor;

a first terminal of the ninth resistor is electrically connected with a second terminal of the tenth resistor, a control terminal of the fourth switching element and a control terminal of the fifth switching element;

a first terminal of the tenth resistor is electrically connected with the battery;

a first terminal of the fourth switching element is electrically connected with the battery;

a second terminal of the fifth switching element is grounded;

a first terminal of the eleventh resistor is electrically connected with a second terminal of the fourth switching element and a first terminal of the fifth switching element, and a second terminal of the eleventh resistor is electrically connected with a control terminal of the sixth switching element; and a first terminal of the sixth switching element is electrically connected with the battery, and a second terminal of the sixth switching element is electrically connected with the power terminal of the motor interface.

17. A non-transitory computer-readable storage medium having stored therein an executable computer program that, when executed by a processor, causes a method for identifying a brush type to be implemented, wherein the method comprises:

acquiring a detection voltage of a brush motor of a cleaning device, wherein the detection voltage is less than a starting voltage of the brush motor, and the brush motor is not started;

acquiring a first impedance of the brush motor, in response to inputting the detection voltage to the brush motor; and determining a brush type corresponding to the brush motor based on the first impedance and a correspondence between impedances and brush types stored.

18. The non-transitory computer-readable storage medium according to claim 17, wherein acquiring the detection voltage of the brush motor of the cleaning device comprises:

acquiring respective starting voltages of at least one brush motor of the cleaning device to obtain an initial detection voltage, wherein the initial detection voltage is less than a minimum starting voltage by at least one voltage adjustment step;

determining a duty ratio of a driving signal based on the initial detection voltage and a battery voltage; and controlling an operation of the brush motor according to the duty ratio to obtain the detection voltage of the brush motor.

19. The non-transitory computer-readable storage medium according to claim 17, wherein acquiring the first impedance of the brush motor comprises:

acquiring an operating current of the brush motor to obtain a detection current; and determining the first impedance of the brush motor according to the detection voltage and the detection current.

20. The non-transitory computer-readable storage medium according to claim 17, wherein the method further comprises:

determining a motor control parameter corresponding to the brush type based on a correspondence between brush types and motor control parameters stored, wherein the motor control parameter comprises at least one of: a driving voltage, a protection current and a protection voltage of an electric brush; and controlling an operation of the electric brush according to the motor control parameter.

* * * * *